(12) United States Patent
Kasuya

(10) Patent No.: US 6,753,215 B2
(45) Date of Patent: Jun. 22, 2004

(54) METHODS FOR MANUFACTURING SEMICONDUCTOR DEVICES AND SEMICONDUCTOR DEVICES

(75) Inventor: Yoshikazu Kasuya, Sakuta (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/963,903

(22) Filed: Sep. 26, 2001

(65) Prior Publication Data

US 2002/0117726 A1 Aug. 29, 2002

(30) Foreign Application Priority Data

Sep. 26, 2000 (JP) ........................... 2000-292142

(51) Int. Cl.$^7$ .................. H01L 21/336; H01L 21/3205
(52) U.S. Cl. .................. 438/197; 438/585; 438/586; 438/595; 438/596
(58) Field of Search ....................... 438/197, 585, 438/586, 595, 596

(56) References Cited

U.S. PATENT DOCUMENTS

| | | | |
|---|---|---|---|
| 4,786,609 A | 11/1988 | Chen | 437/30 |
| 5,306,655 A | 4/1994 | Kurimoto | 437/44 |
| 5,391,510 A | 2/1995 | Hsu et al. | 437/44 |
| 5,405,787 A | 4/1995 | Kurimoto | 437/28 |
| 5,434,093 A | 7/1995 | Chau et al. | 437/41 |
| 5,721,443 A | 2/1998 | Wu | 257/344 |
| 5,879,998 A | 3/1999 | Krivokapic | 438/300 |
| 5,937,299 A | 8/1999 | Michael et al. | 438/299 |
| 5,960,270 A | * 9/1999 | Misra et al. | 438/197 |
| 5,976,934 A | 11/1999 | Hayakawa | 438/258 |
| 5,986,302 A | 11/1999 | Fukatsu et al. | 257/315 |
| 6,087,231 A | 7/2000 | Xiang et al. | 438/287 |
| 6,228,717 B1 | 5/2001 | Hazama et al. | 438/265 |
| 6,271,094 B1 | 8/2001 | Boyd et al. | 438/287 |
| 6,348,385 B1 | 2/2002 | Cha et al. | 438/287 |
| 6,365,459 B1 | 4/2002 | Leu | 438/266 |
| 6,403,997 B1 | 6/2002 | Inumiya et al. | 257/288 |
| 6,465,359 B2 * | 10/2002 | Yamada et al. | 438/706 |

FOREIGN PATENT DOCUMENTS

JP        4-155932        5/1992        ......... H01L/21/336

OTHER PUBLICATIONS

U.S. application Ser. No. 09/963,168, filed Sep. 26, 2001, having U.S. patent appl. Pub. No. U.S.2002/0084476 A1, published on Jul. 4, 2002, and pending claims.
U.S. application Ser. No. 09/963,924, filed Sep. 26, 2001, having U.S. patent appl. Pub. No. U.S.2002/0084498 A1, published on Jul. 4, 2002, and pending claims.

* cited by examiner

Primary Examiner—Long Pham
Assistant Examiner—Shrinivas H Rao
(74) Attorney, Agent, or Firm—Konrad Raynes & Victor, LLP; Alan S. Raynes

(57) ABSTRACT

Semiconductor devices and methods for manufacturing the same in which deterioration of electrical characteristics are suppressed are described. One method for manufacturing a semiconductor device includes the steps of: forming a gate dielectric layer 20 and a silicon layer 32 on a semiconductor layer 10; forming sidewall insulation layer 62 at the sides of the silicon layer 32; forming a planarized first insulation layer 50; removing the silicon layer 32 in a manner that the gate dielectric layer 20 is not exposed, to thereby form a recessed section 80; partially filling a metal layer 34 in the recessed section 80; forming a second insulation layer 60 in a recessed section 82; etching the first insulation layer 50 to form a through hole 90a; and forming a contact layer 92a in the through hole 90a. The second insulation layer 60 and the sidewall insulation layer 62 are formed from a material different from that of the first insulation layer 50.

18 Claims, 13 Drawing Sheets

Fig. 12 (a) (prior art)
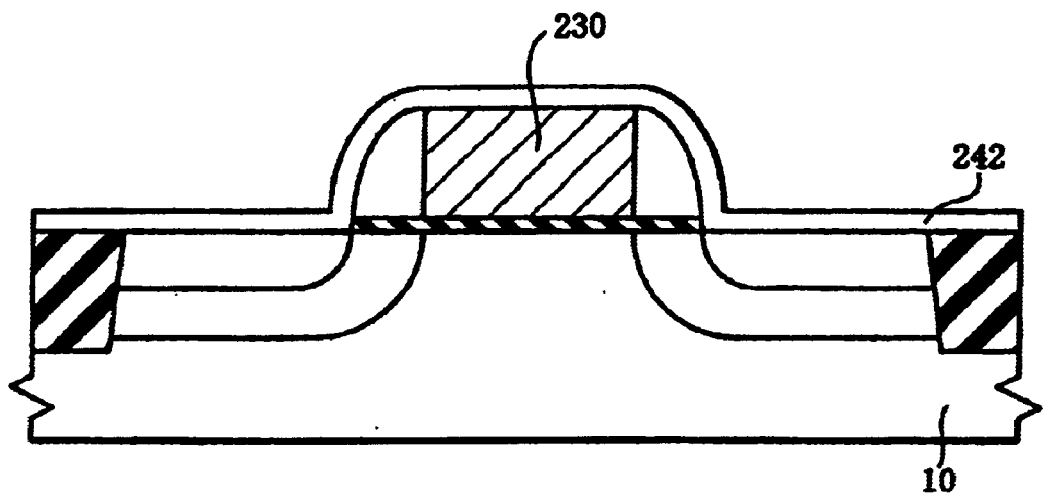
Fig. 12 (b) (prior art)
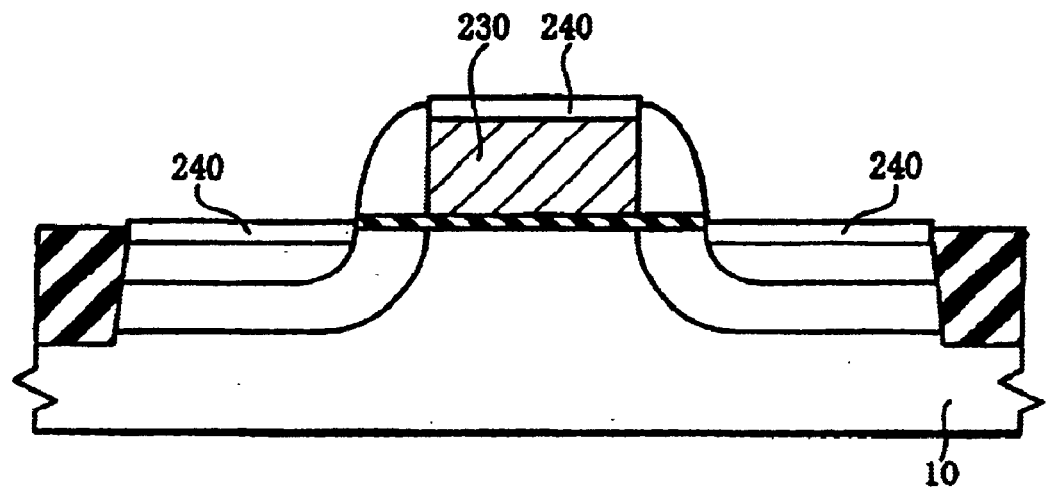

Fig. 13 (a) (prior art)
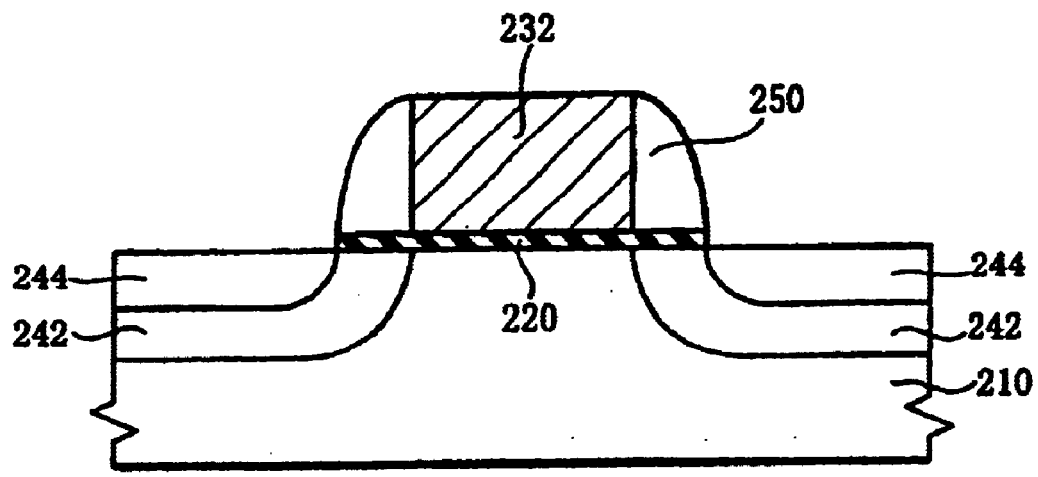
Fig. 13 (b) (prior art)
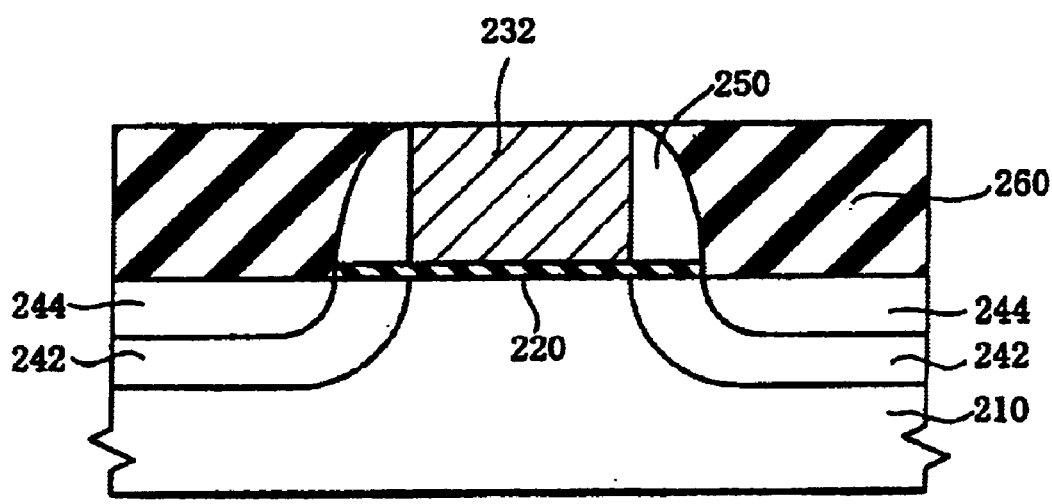

Fig. 14 (a) (prior art)
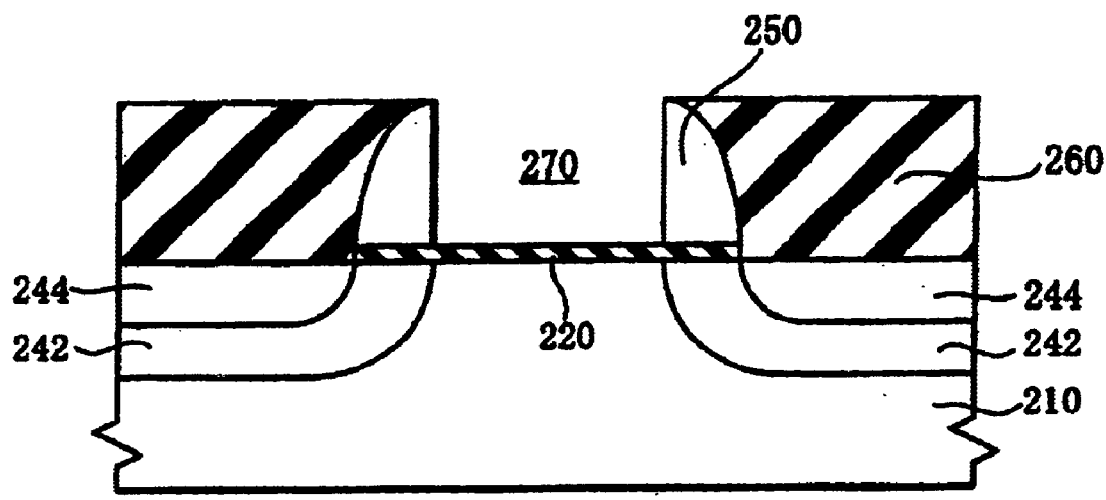
Fig. 14 (b) (prior art)
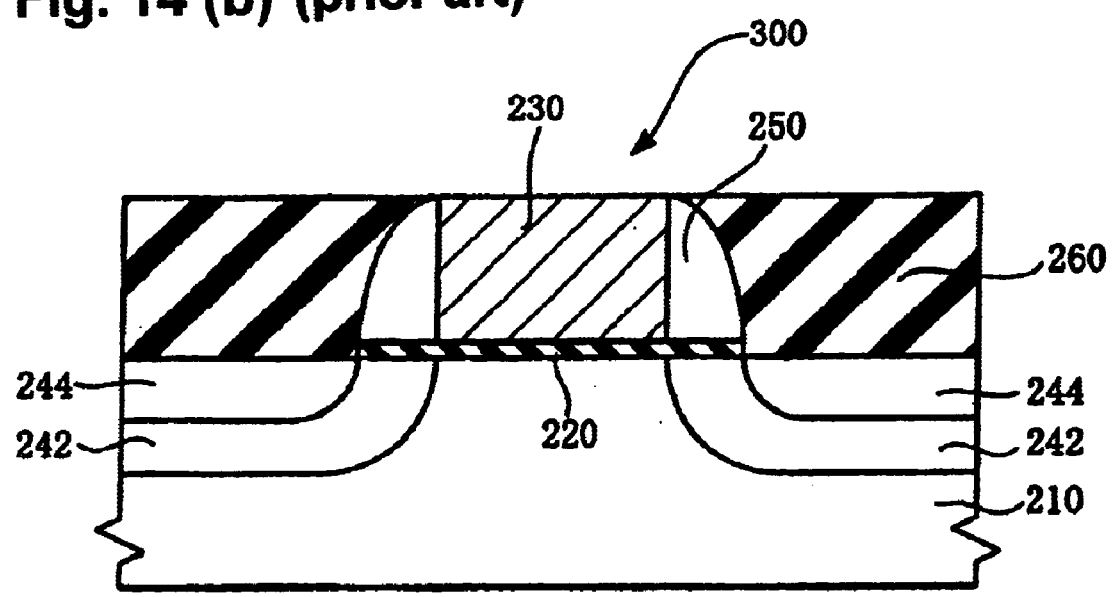

METHODS FOR MANUFACTURING SEMICONDUCTOR DEVICES AND SEMICONDUCTOR DEVICES

Applicant hereby incorporates by reference Japanese Application No. 2000-292142, filed Sep. 26, 2000, in its entirety. Applicant hereby incorporates by reference U.S. application Ser. No. 09/963,168, filed Sep. 26, 2001, in its entirety. Applicant hereby incorporates by reference U.S. application Ser. No. 09/963,924, filed Sep. 26, 2001, in its entirety.

TECHNICAL FIELD

The present invention relates to semiconductor devices having a field effect transistor and methods for manufacturing the same, and more particularly, to semiconductor devices having a gate electrode that is formed from two or more layers and methods for manufacturing the same.

RELATED ART

Currently, there is a technique in which a gate electrode 230 of a MOS transistor 300 shown in FIG. 14(b) is formed by a so-called damascene method. One example of a method for manufacturing a MOS transistor 300 using a technique in which its gate electrode 230 is formed by a damascene method is described below.

As shown in FIG. 13(a), a gate dielectric layer 220 (also sometimes referred to as a gate insulation layer) and a dummy electrode 232 are formed on a silicon substrate 210. Next, the dummy electrode 232 is patterned. Then, a low concentration impurity diffusion layer 242 is formed in the silicon substrate 210 on the sides of the dummy electrode 232. Next, an insulation layer is formed over the entire surface, and the insulation layer and the gate dielectric layer 220 are etched by RIE to form a sidewall spacer 250 on the side wall of the dummy electrode 232. Then, a high concentration impurity diffusion layer 244 is formed in the silicon substrate 210 on the side of the sidewall spacer 250.

Next, as shown in FIG. 13(b), an insulation layer 260 is formed on the silicon substrate 210, and the insulation layer 260 is then planarized to expose the dummy electrode 232.

Next, as shown in FIG. 14(a), the entire dummy electrode 232 is removed to form a through hole 270.

Next, as shown in FIG. 14(b), a metal layer is formed in a manner to fill the through hole 270, and the metal layer is then etched-back to form a gate electrode 230.

Techniques to form gate electrodes by a damascene method are described in references such as U.S. Pat. No. 5,960,270, U.S. Pat. No. 5,391,510 and U.S. Pat. No. 5,434,093.

SUMMARY

Embodiments include a method for manufacturing a semiconductor device, the method including the steps of: (a) forming a gate dielectric layer on a semiconductor layer; (b) forming a first conduction layer having a specified pattern on the gate dielectric layer; (c) forming sidewall insulation layers on side walls of the first conduction layer; (d) forming a source region and a drain region in the semiconductor layer; (e) depositing a first insulation layer that covers the first conduction layer and the sidewall insulation layers, the first insulation layer comprising a material different from that of the sidewall insulation layers; (f) planarizing the first insulation layer until an upper surface of the first conduction layer is exposed; (g) removing a part of the first conduction layer in a manner that the gate dielectric layer is not exposed to thereby form a recessed section on the first conduction layer between the sidewall insulation layers; (h) partially filling a second conduction layer in the recessed section to form a gate electrode that includes at least the first conduction layer and the second conduction layer; (i) forming a second insulation layer at the recessed section on the second conduction layer, the second insulation layer being composed of a material different from that of the first insulation layer; (j) etching the first insulation layer to form a first through hole that reaches the source region or the drain region; and (k) forming a first contact layer in the first through hole.

Embodiments also include a method for manufacturing a semiconductor device, including forming a gate dielectric layer on a semiconductor layer and forming a first conduction layer having a specified pattern on the gate dielectric layer. Sidewall insulation layers are formed on side walls of the first conduction layer. A source region and a drain region are formed in the semiconductor layer. A part of the first conduction layer is removed in a manner so that the gate dielectric layer is not exposed, to thereby form a recessed section on the first conduction layer between the sidewall insulation layers. The removing a part of the first conduction layer is carried out after formation of the source region and the drain region. The method also includes forming a second conduction layer in a portion of the recessed section, and forming an insulation layer in the recessed section on the second conduction layer.

Embodiments also include semiconductor device including a field effect transistor, the field effect transistor including a gate dielectric layer, a gate electrode, a source region and a drain region. The device includes a second insulation layer formed on the gate electrode and sidewall insulation layers formed on side walls of the gate electrode. A first insulation layer is formed on the sides of sidewall insulation layers. The gate electrode includes a first conduction layer and a second conduction layer, the first conduction layer being formed on the gate dielectric layer, and the second conduction layer being formed above the first conduction layer. A first through hole reaching the source region or the drain region is formed in the first insulation layer. A first contact layer is formed in the first through hole. As the thickness of the first conduction layer is compared based on a top surface of the gate dielectric layer, the first conduction layer has thickness that gradually becomes greater from a central section thereof toward the side walls.

Embodiments also include a semiconductor device including a field effect transistor, the field effect transistor including a gate dielectric layer, a gate electrode, a source region and a drain region. The device includes a second insulation layer formed on the gate electrode, and sidewall insulation layers formed on side walls of the gate electrode. A first insulation layer is formed on the sides of sidewall insulation layers. The gate electrode includes a first conduction layer and a second conduction layer, the first conduction layer being formed on the gate dielectric layer, and the second conduction layer being formed above the first conduction layer. A first through hole reaching the source region or the drain region is formed in the first insulation layer. A first contact layer is formed in the first through hole. As the thickness of the first conduction layer is compared based on a top surface of the gate dielectric layer, an end portion of the first conduction layer has a greater thickness as compared to a thickness at a central section.

BRIEF DESCRIPTION OF THE DRAWINGS

Embodiments of the invention are described with reference to the accompanying drawings which, for illustrative purposes, are schematic and not necessarily drawn to scale.

FIGS. 12(a) and 12(b) schematically show cross-sectional views illustrating a comparison example of a modified embodiment.

FIGS. 13(a) and 13(b) schematically show cross-sectional views illustrating steps of a method for manufacturing a semiconductor device in a conventional example.

FIGS. 14(a) and 14(b) schematically show cross-sectional views illustrating steps of a method for manufacturing a semiconductor device in a conventional example.

DETAILED DESCRIPTION

Figure 1:
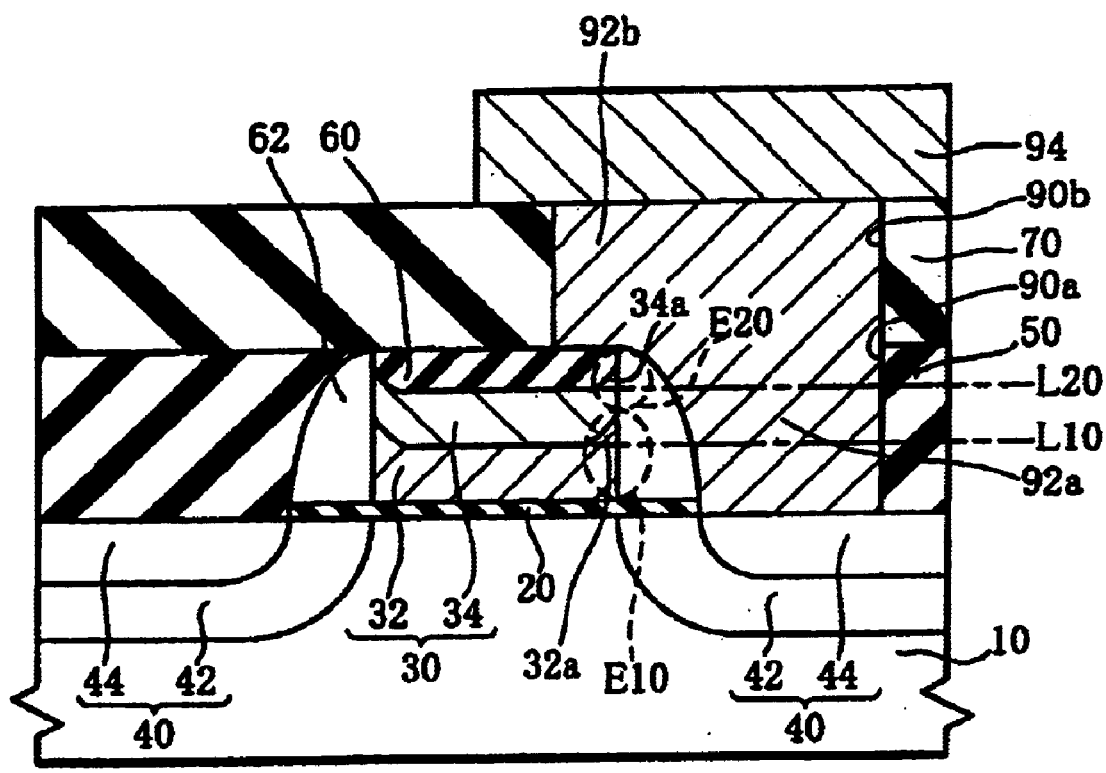
FIG. 1 schematically shows a cross-sectional view of a semiconductor device in accordance with an embodiment of the present invention.
Figure 2:
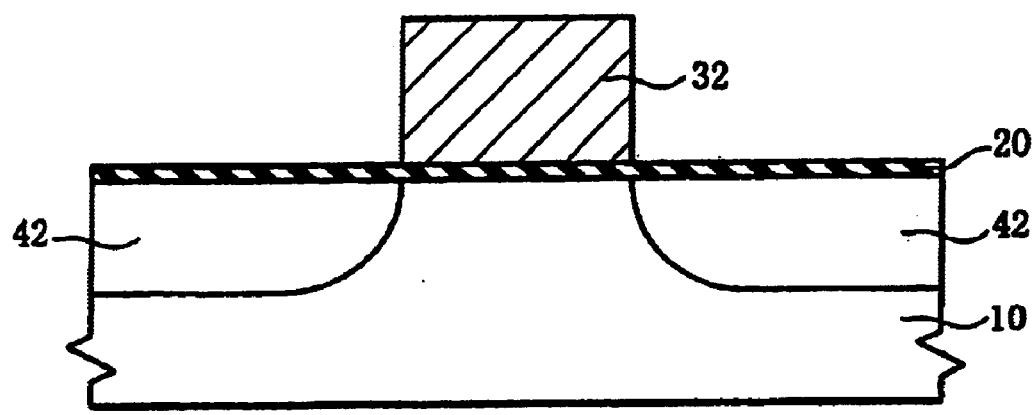
FIGS. 2(a) and 2(b) schematically show cross-sectional views illustrating steps of a method for manufacturing a semiconductor device in accordance with an embodiment of the present invention.
Figure 2:
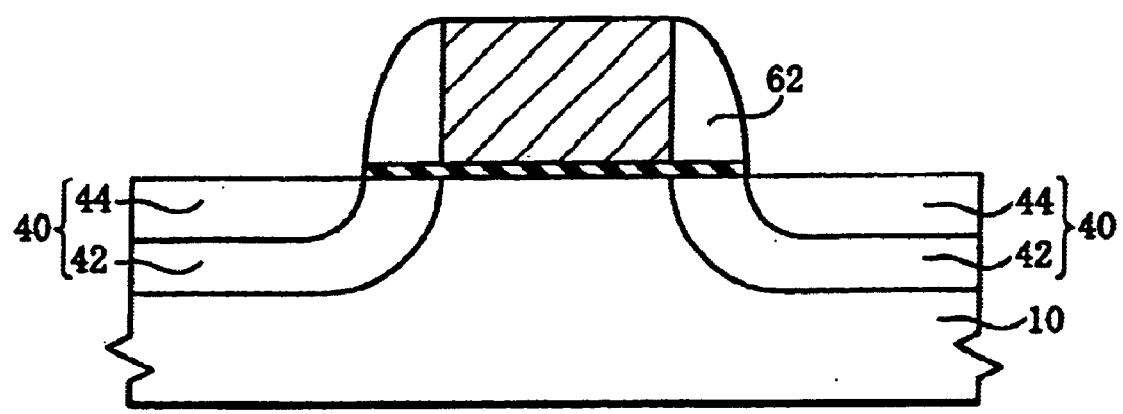
Figure 3:
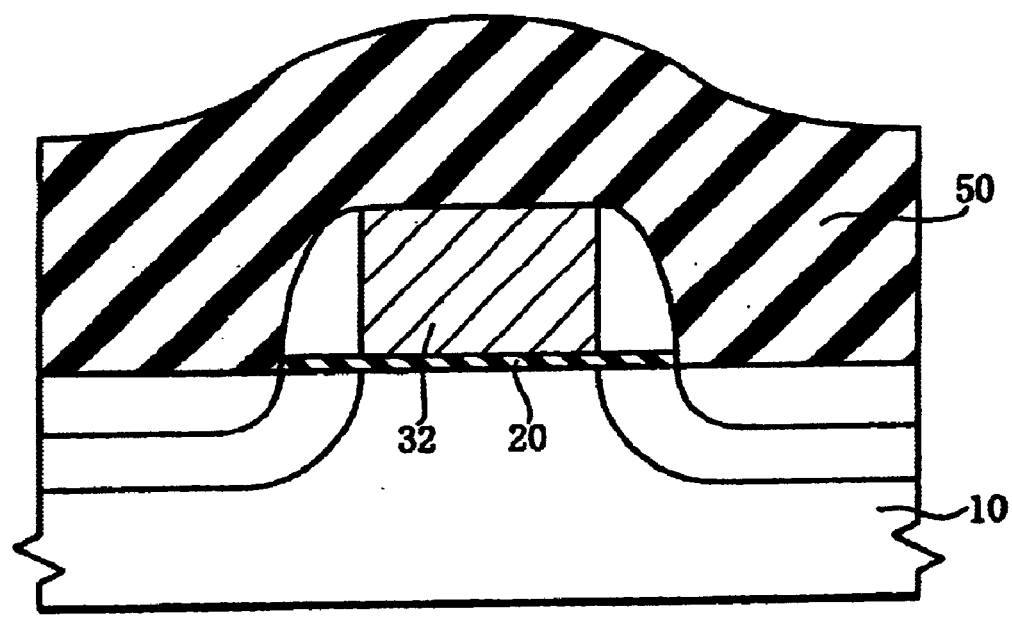
FIGS. 3(a) and 3(b) schematically show cross-sectional views illustrating steps of a method for manufacturing a semiconductor device in accordance with an embodiment of the present invention.
Figure 3:
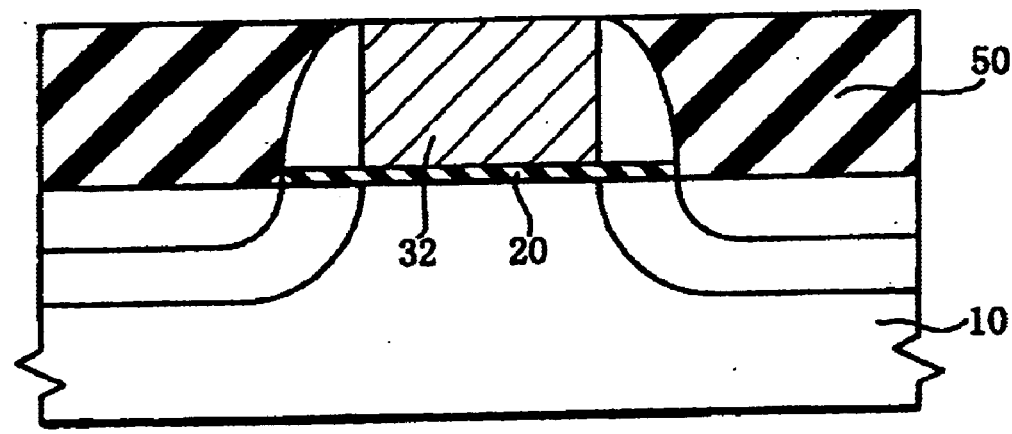
Figure 4:
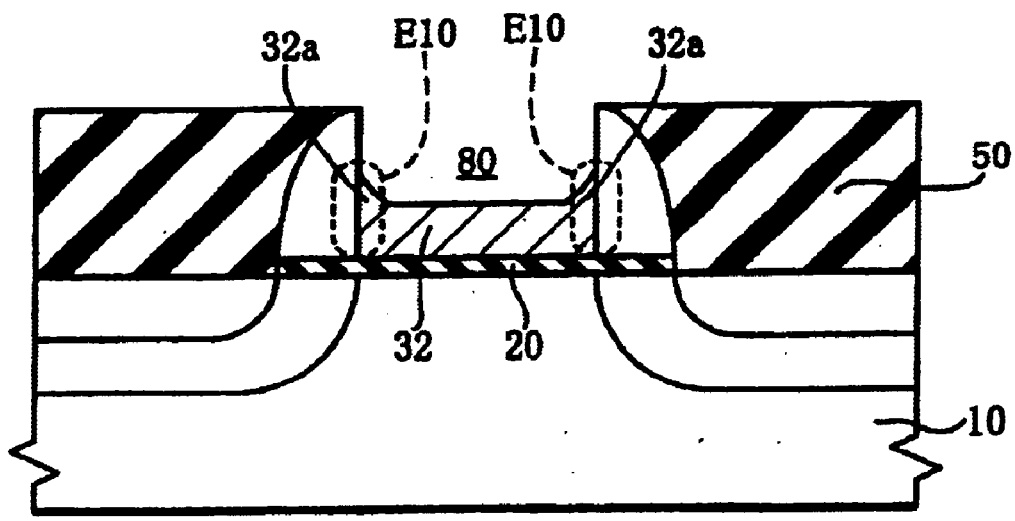
FIGS. 4(a) and 4(b) schematically show cross-sectional views illustrating steps of a method for manufacturing a semiconductor device in accordance with an embodiment of the present invention.
Figure 4:
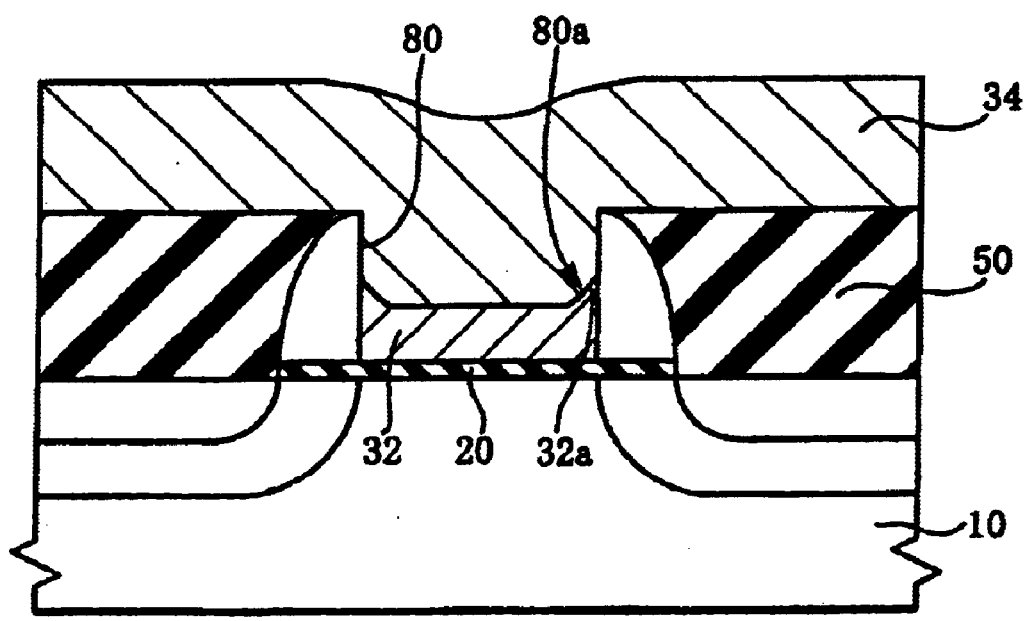
Figure 5:
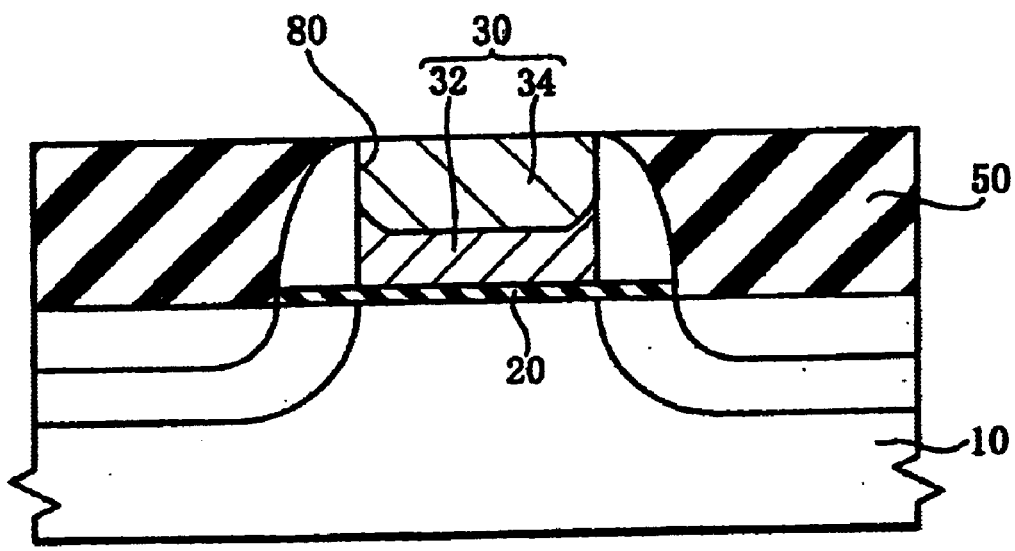
FIGS. 5(a) and 5(b) schematically show cross-sectional views illustrating steps of a method for manufacturing a semiconductor device in accordance with an embodiment of the present invention.
Figure 5:
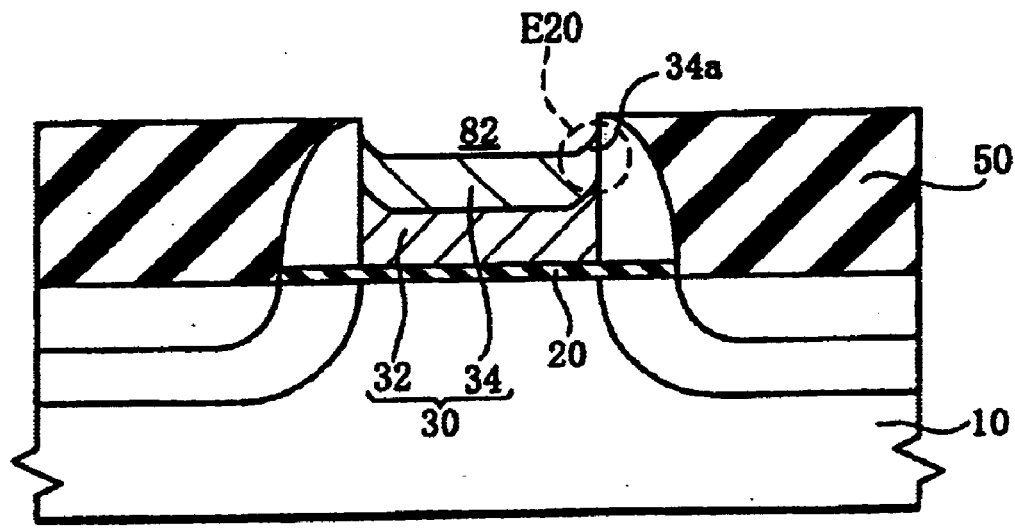
Figure 6:
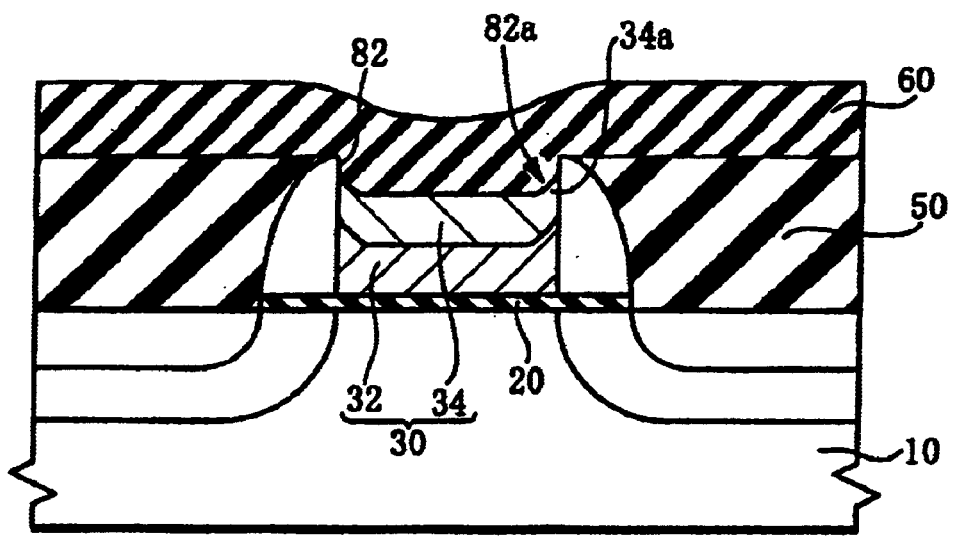
FIGS. 6(a) and 6(b) schematically show cross-sectional views illustrating steps of a method for manufacturing a semiconductor device in accordance with an embodiment of the present invention.
Figure 6:
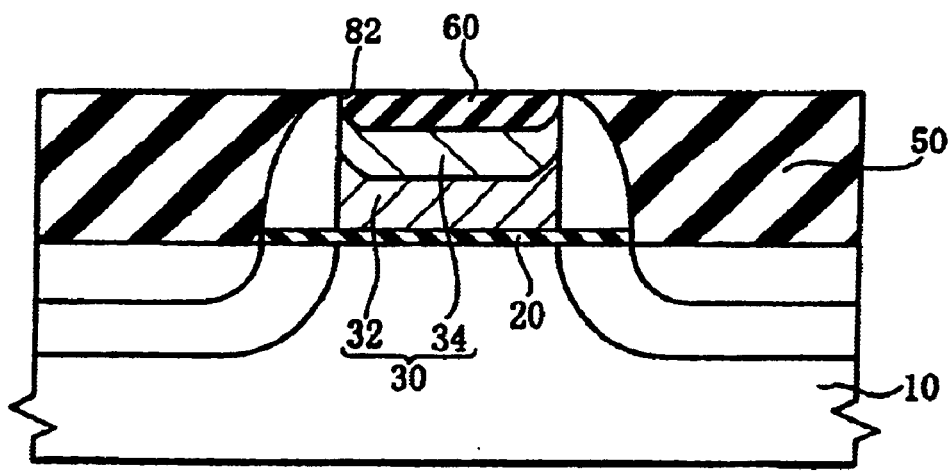
Figure 7:
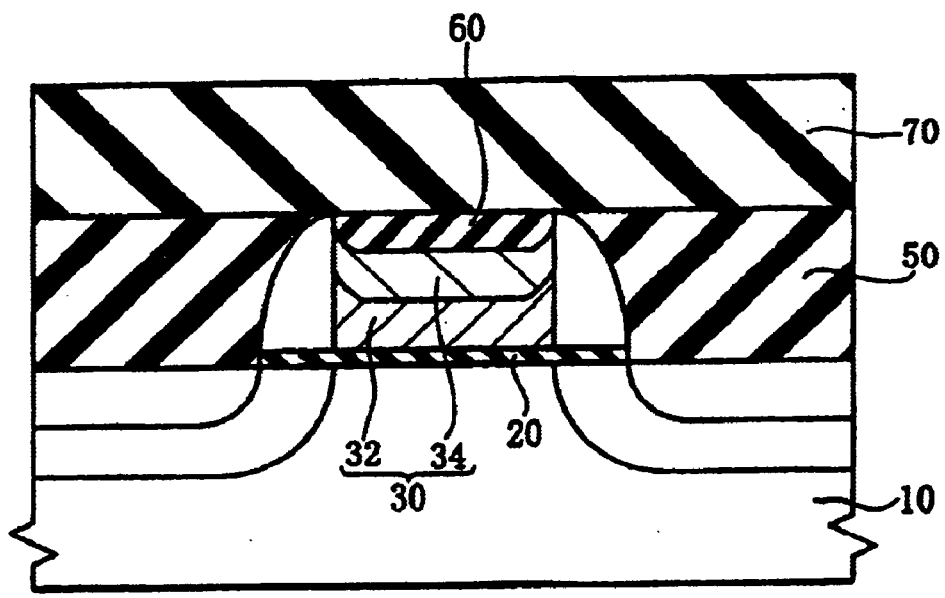
FIGS. 7(a) and 7(b) schematically show cross-sectional views illustrating steps of a method for manufacturing a semiconductor device in accordance with an embodiment of the present invention.
Figure 7:
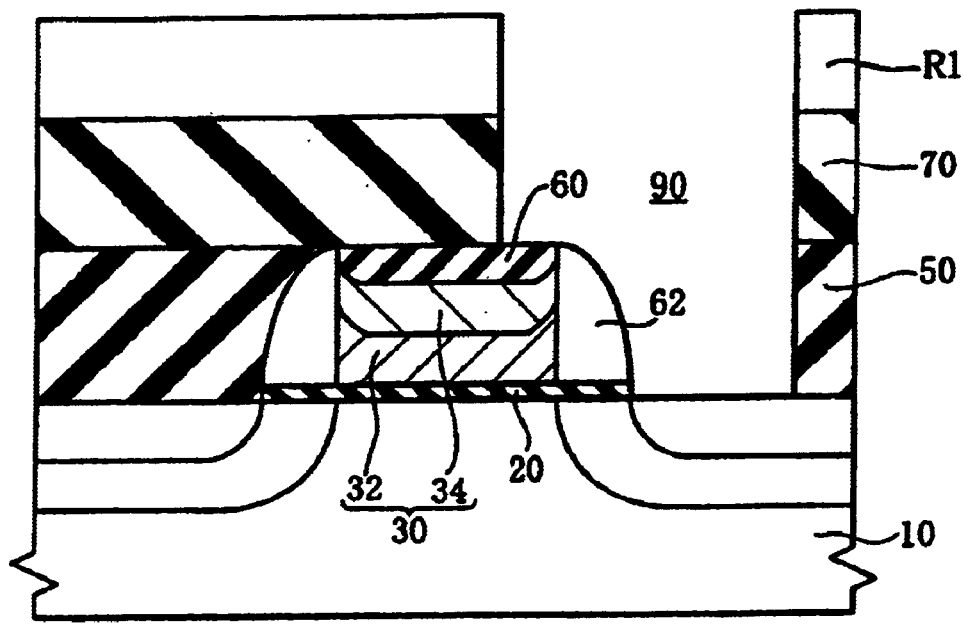

It is an object of certain embodiments of the present invention to provide semiconductor devices and methods for manufacturing the same in which deterioration of the electrical characteristics is suppressed.

A method for manufacturing a semiconductor device in accordance with an embodiment of the present invention comprises the steps (a)–(k) of:

(a) forming a gate dielectric layer on a semiconductor layer;

(b) forming a first conduction layer having a specified pattern on the gate dielectric layer;

(c) forming sidewall insulation layers on side walls of the first conduction layer;

(d) forming a source region and a drain region in the semiconductor layer;

(e) depositing a first insulation layer that covers the first conduction layer and the sidewall insulation layers, the first insulation layer being composed of a material different from that of the sidewall insulation layers;

(f) planarizing the first insulation layer until an upper surface of the first conduction layer is exposed;

(g) removing a part of the first conduction layer in a manner that at least the gate dielectric layer is not exposed to thereby form a recessed section on the first conduction layer;

(h) partially filling a second conduction layer in the recessed section to form a gate electrode that includes at least the first conduction layer and the second conduction layer;

(i) forming a second insulation layer at the recessed section on the second conduction layer, the second insulation layer being composed of a material different from that of the first insulation layer;

(j) etching the first insulation layer to form a first through hole that reaches the source region or the drain region; and (k) forming a first contact layer in the first through hole.

In the present embodiment, the gate dielectric layer is not exposed in step (g). As a result, deterioration of the gate dielectric layer is suppressed.

Also, in accordance with the present embodiment, the second conduction layer is formed over the first conduction layer in step (h). As a result, the second conduction layer is formed after the formation of the source and drain regions. As a result, deterioration of the second conduction layer, which may occur when a resist layer that is provided for forming the source and drain regions is removed, may be prevented. Accordingly, deterioration of the second conduction layer may be suppressed. Also, in accordance with the present embodiment, a chemical agent that is incompatible with the second conduction layer, but that can securely remove the resist layer, can be selected. In view of the above, in accordance with the present embodiment, a semiconductor device in which deterioration of its electrical characteristic is suppressed can be formed.

Also, in accordance with the present embodiment, the second insulation layer is formed over the second conduction layer, and the sidewall insulation layer is formed on the sides of the first conduction layer and the second conduction layer. The second insulation layer and the sidewall insulation layers are formed from materials different from that of the first insulation layer. As a result, the second insulation layer and the sidewall insulation layers can function as stopper layers in step (j), such that the first through hole can be formed in a self-aligned manner with respect to the first and second conduction layers. In other words, a self-aligned-contact is achieved.

In step (j), the second insulation layer and the sidewall insulation layers may preferably be composed of a material that is more difficult to be etched compared to the first insulation layer. As a result, the second insulation layer and the sidewall insulation layers can more securely function as stopper layers in step (j).

Also, in accordance with certain embodiments of the present invention, when the first conduction layer is a silicon layer, step (h) may include the steps of (h-1) depositing a metal layer for siliciding the first conduction layer on the first conduction layer; and (h-2) siliciding the first conduction layer to form a silicide layer.

As a result, the first conduction layer can be silicided, and at the same time a self-aligned contact can be conducted.

Also, certain embodiments of the present invention may further comprise the steps of:

(l) forming a third insulation layer on the first insulation layer and the second insulation layer;

(m) etching the third insulation layer to form a second through hole; and (n) forming a second contact layer in the second through hole, wherein the first through hole may be continuous with the second through hole.

In step (j), the second insulation layer may preferably be formed from a material having a ratio of an etching rate of the second insulation layer with respect to an etching rate of the first insulation layer (an etching rate of the second insulation layer/an etching rate of the first insulation layer) being two or greater. More specifically, when the first insulation layer is formed from silicon oxide, the second insulation layer may be formed from silicon nitride.

Also, in step (j), the sidewall insulation layers may preferably be formed from a material having a ratio of an etching rate of the sidewall insulation layers with respect to an etching rate of the first insulation layer being two or greater. More specifically, when the first insulation layer is formed from silicon oxide, the sidewall insulation layers are preferably formed from silicon nitride.

A first semiconductor device in accordance with an embodiment of the present invention includes a field effect transistor, the field effect transistor including a gate dielectric layer, a gate electrode, a source region and a drain region, and comprising:

a second insulation layer formed on the gate electrode;

sidewall insulation layers formed on side walls of the gate electrode;

a first insulation layer formed on the sides of sidewall insulation layers, the gate electrode including a first conduction layer and a second conduction layer, the first conduction layer being formed on the gate dielectric layer, the second conduction layer being formed above the first conduction layer;

a first through hole reaching the source region or the drain region formed in the first insulation layer; and a first contact layer formed in the first through hole, wherein, as the thickness of the first conduction layer is compared based on a top surface of the gate dielectric layer, the first conduction layer has thickness that gradually becomes greater from a central section thereof toward the side walls thereof.

A second semiconductor device in accordance with an embodiment of the present invention includes a field effect transistor, the field effect transistor including a gate dielectric layer, a gate electrode, a source region and a drain region, and comprising:

a second insulation layer formed on the gate electrode;

sidewall insulation layers formed on side walls of the gate electrode;

a first insulation layer formed on the sides of sidewall insulation layers, the gate electrode including a first conduction layer and a second conduction layer, the first conduction layer being formed on the gate dielectric layer, the second conduction layer being formed above the first conduction layer;

a first through hole reaching the source region or the drain region formed in the first insulation layer;

a first contact layer formed in the first through hole, wherein, as the thickness of the first conduction layer is compared based on a top surface of the gate dielectric layer, an side end portion of the first conduction layer has a greater thickness as compared to a thickness thereof at a central section thereof.

In addition to the features described above for the first and second semiconductor devices, embodiments may also have at least some of the following features.

(1) In certain embodiments, as the height of an upper surface of the second conduction layer is compared based on an upper surface of the gate dielectric layer, the height of the upper surface of the second conduction layer gradually becomes higher from a central section thereof toward the side walls.

(2) In certain embodiments, as the height of an upper surface of the second conduction layer is compared based on an upper surface of the gate dielectric layer, the height of the upper surface of the second conduction layer at the side wall sections thereof is higher than a height of the upper surface of a central section thereof.

(3) In certain embodiments, the second conduction layer is formed from one of metal, a metal alloy and a metal compound.

(4) In certain embodiments, the first conduction layer is a silicon layer, and the second conduction layer is a silicide layer.

(5) In certain embodiments, a third insulation layer is formed on the first insulation layer and the second insulation layer;

a second through hole is formed in the third insulation layer, being continuous with the first through hole; and a second contact layer is formed in the second through hole.

(6) In certain embodiments, the first insulation layer is formed from silicon oxide, and the second insulation layer is formed from silicon nitride.

(7) In certain embodiments, the first insulation layer is formed from silicon oxide, and the sidewall insulation layers are formed from silicon nitride.

(8) In certain embodiments, the upper surface of the first insulation layer and the upper surface of the second insulation layer are substantially at the same level. It is noted that the "substantially at the same level" means that they are substantially at the same height from the upper surface of the gate dielectric layer.

In the above embodiments, the "semiconductor layer" includes a semiconductor substrate and a semiconductor layer formed on a substrate.

Certain preferred embodiments of the present invention are described below with reference to the accompanying drawings.

A semiconductor device in accordance with an embodiment of the present invention is described below. FIG. 1 schematically shows a cross-sectional view of a semiconductor device in accordance with the present embodiment. More specifically, a semiconductor device 100 has a structure as follows.

A gate dielectric layer 20 is formed on a silicon substrate 10. A gate electrode 30 is formed on the gate dielectric layer. The gate electrode 30 is formed from a polysilicon layer (first conduction layer) 32 and a metal layer (second conduction layer) 34 successively formed on top of the other over the gate dielectric layer 20. Sidewall insulation layers 62 are formed on both sides of the gate electrode 30.

Next, a preferred cross-sectional shape of the polysilicon layer 32 is described. The polysilicon layer 32 has protruded sections 32a at side end sections E10 at upper sections thereof. More specifically, the level of the upper surface of the polysilicon layer 32 at the side end sections E10 upwardly protrudes compared to a level L10 of the upper surface of the polysilicon layer 32 at its central section. In other words, the thickness of the polysilicon layer 32 is not uniform as measured based on the upper surface of the gate dielectric layer 20, but gradually increases from the central section toward the sidewall (toward the side of the sidewall spacers 50). As a result, due to the protruded sections 32a formed at the side end sections E10, the side end sections of the polysilicon layer 32 have a tapered shape.

Next, a preferred cross-sectional shape of the metal layer 34 is described. The metal layer 34 also has protruded sections 34a at side end sections at upper sections thereof, in a similar manner as the polysilicon layer 32. More specifically, the level of the upper surface of the metal layer 34 at the side end sections E20 upwardly protrudes compared to a level L20 of the upper surface of the metal layer 34 at its central section. In other words, the height of the upper surface of the polysilicon layer 32 is not uniform as measured based on the upper surface of the gate dielectric layer 20, but gradually increases from the central section toward the sidewall (toward the side of the sidewall spacers 50). As a result, due to the protruded sections 34a formed at the side end sections E20, the side end sections of the metal layer 34 have a tapered shape.

Source and drain regions 40 are formed in the silicon substrate 10 at sides of the gate electrode 30. The source and drain regions 40 have a low concentration impurity diffusion layer 42 and a high concentration impurity diffusion layer 44. The low concentration impurity diffusion layer 42 is formed in a manner to enclose the high concentration impurity diffusion layer 44, in other words, has a double drain structure (double diffused drain). However, without being limited to this structure, the source and drain regions 40 can have a variety of structures such as an LDD (lightly doped drain) structure.

A second insulation layer 60 is formed on the gate electrode 30. Sidewall insulation layers 62 are formed on both sides of the gate electrode 30 and the second insulation layer 60. A first insulation layer 50 is formed on the sides of the gate electrode 30 with the sidewall insulation layers 62 being interposed therebetween. Preferably, the upper surface of first insulation layer 50 and the upper surface of the second insulation layer 60 are substantially at the same level (height) as measured based on the upper surface of the gate dielectric layer 20.

A third insulation layer 70 is formed on the first insulation layer 50 and the second insulation layer 60. A first through hole 90a is formed in the first insulation layer 50, and a second through hole 90b is formed in the third insulation layer 70. The first through hole 90a is continuous with the second through hole 90b. First and second contact layers 92a and 92b are formed in the first and second through holes 90a and 90b, respectively. A wiring layer 94 is formed on the second contact layer 92b and the third insulation layer 70.

A method for manufacturing a semiconductor device in accordance with an embodiment of the present invention is described below. FIG. 2 through FIG. 7 schematically show cross-sectional views in a process for manufacturing a semiconductor device in accordance with the present embodiment.

First, as shown in FIG. 2(a), a stacked layered body of a gate dielectric layer 20 and a polysilicon layer (first conduction layer) 32 is formed on a silicon substrate 10. The stacked layered body may be formed by depositing a gate dielectric layer and a polysilicon layer on the silicon substrate 10, and patterning the polysilicon layer. The thickness of the polysilicon layer 32 is, for example, 100–1000 nm.

Next, a resist layer having a specified pattern is formed over the silicon substrate 10. Next, a low concentration impurity diffusion layer 42 is formed by ion-implanting an impurity in the silicon substrate 10 using the resist layer as a mask. Then, the resist layer is removed by an acid chemical agent.

Next, as shown in FIG. 2(b), sidewall insulation layers 62 are formed on both sides of the polysilicon layer 32 by a known method. The sidewall insulation layers 62 are formed from a material that is more difficult to etch than the first insulation layer 50. Etching the first insulation layer 50 is described below. More specifically, in the etching of the first insulation layer 50 to be described below, the sidewall insulation layers 62 may preferably be formed from a material having a ratio of an etching rate of the sidewall insulation layer with respect to an etching rate of the first insulation layer 50 (an etching rate of the sidewall insulation layer 62/an etching rate of the first insulation layer 50) being two or greater, and more preferably being five or greater. More specifically, when the first insulation layer is formed from silicon oxide, the sidewall insulation layer can preferably be formed from silicon nitride.

Next, a resist layer having a specified pattern is formed on the silicon substrate 10. Next, an impurity is ion-implanted in the silicon substrate 10 using the resist layer as a mask to form a high concentration impurity diffusion layer 44. Then, the resist layer is removed by an acid chemical agent. As a result, source and drain regions 40 are formed.

Next, as shown in FIG. 3(a), a first insulation layer 50 is formed over the silicon substrate 10 in a manner to cover the polysilicon layer 32 and the sidewall insulation layers 62. The first insulation layer 50 can be formed by, for example, a CVD method. Silicon oxide is an example of a material than can be used as the material of the first insulation layer 50. The thickness of the first insulation layer 50 is determined in view of the thickness of the polysilicon layer 32 when the first insulation layer 50 is formed, and may be, for example, 150–1500 nm.

Next, as shown in FIG. 3(b), the first insulation layer 50 is planarized. The first insulation layer 50 is planarized until the upper surface of the polysilicon layer 32 is exposed. The first insulation layer 50 may be planarized by, for example, a chemical-mechanical polishing method.

Next, as shown in FIG. 4(a), a part of the polysilicon layer 32 is etched in a manner that the gate dielectric layer 20 is not exposed. As a result, a first recessed section 80 is preferably formed in an upper portion of the polysilicon layer 32. The thickness of the polysilicon layer 32 that is removed is defined in view of characteristics of a desired gate electrode, and may be for example 50–950 nm, and more preferably 50–800 nm. The etching can be conducted by, for example, a reactive ion etching. In this etching, as shown in FIG. 4(a), protruded sections 32a are formed at side end sections E10 of the polysilicon layer 32 at upper sections thereof. The protruded sections 32a are formed because the side end sections E10 of the polysilicon layer 32 are more difficult to etch compared to the central section of the polysilicon layer 32.

Also, in this etching step, not the entire polysilicon layer 32 is removed, but only a specified thickness thereof is partially removed. As a result, in the etching of the polysilicon layer 32, the gate dielectric layer 20 is not exposed. Accordingly, the gate dielectric layer 20 is inhibited or prevented from being damaged during the etching of the polysilicon layer 32.

Next, as shown in FIG. 4(b), a metal layer 34 is preferably formed over the entire surface, to fill the first recessed section 80. In this instance, because the protruded sections 32a are formed in the polysilicon layer 32, the metal layer 34 can be readily deposited at corner sections 80a of the recessed section 80. This is because the polysilicon layer 32 has a tapered configuration due to the protruded sections 32a formed at the side end sections E10, with the result that the step coverage is improved. For example, tungsten, aluminum, copper, an alloy of aluminum and copper, and a compound of silicon and metal may be used as the material of the metal layer 34. For example, titanium silicide, tungsten silicide, cobalt silicide, molybdenum silicide or the like can be used as the compound of silicon and metal. The metal layer 34 can be formed by, for example, a CVD method.

Next, as shown in FIG. 5(a), the metal layer 34 is planarized in a manner that the metal layer 34 remains only in the first recessed section 80. The metal layer 34 can be planarized by, for example, a chemical-mechanical polishing method.

Next, as shown in FIG. 5(b), a part of the metal layer 34 is etched to form a second recessed section 82. Here, as a result of forming the second recessed section 82, the metal layer 34 is partially filled in the first recessed section 80. The thickness of the metal layer 34 that is removed is defined in view of a desired thickness of the second insulation layer 60. In other words, the thickness of the metal layer 34 that is removed is not particularly limited as long as the second insulation layer 60 can function as a stopper layer, and may be, for example, 10–50 nm. The etching can be conducted by, for example, a reactive ion etching. In this etching, protruded sections 34a are preferably formed at side end sections E20 of the metal layer at upper sections thereof. The protruded sections 34a are formed because the side end sections E20 of the metal layer 34 are more difficult to etch compared to the central section of the metal layer 34.

Next, as shown in FIG. 6(a), a second insulation layer 60 is deposited over the entire surface, to fill the second recessed section 82. In this instance, because the protruded sections 34a are formed in the metal layer 34, the second insulation layer 60 can be readily deposited at corner sections 82a of the second recessed section 82. This is because the metal layer 34 has a tapered configuration due to the protruded sections 34a formed at the side end sections E10, with the result that the step coverage is improved. The second insulation layer 60 may be formed by, for example, a CVD method. The second insulation layer 60 is formed from a material that is more difficult to be etched than the first insulation layer 50 in etching the first insulation layer 50, which is to be described below. More specifically, in the etching of the first insulation layer 50 to be described below, the second insulation layer 60 may preferably be formed from a material having a ratio of an etching rate of the second insulation layer 60 with respect to an etching rate of the first insulation layer 50 (an etching rate of the second insulation layer 60/an etching rate of the first insulation layer 50) being two or greater, and more preferably being five or greater. More specifically, when the first insulation layer is formed from silicon oxide, the second insulation layer can be formed from silicon nitride.

Next, as shown in FIG. 6(b), by planarizing the second insulation layer 60, the second insulation layer 60 is left only in the second recessed section 82. The planarization can be conducted by, for example, a chemical-mechanical polishing method.

Next, as shown in FIG. 7(a), a third insulation layer 70 is formed over the first insulation layer 50 and the second insulation layer 60 by a known method. The third insulation layer 70 can be formed from, for example, silicon oxide.

Next, as shown in FIG. 7(b), a resist layer R1 is formed on the third insulation layer 70. The resist layer R1 has an opening above a region where a second through hole 90b is to be formed. Next, using the resist layer R1 as a mask, the third insulation layer 70 and the first insulation layer 50 are etched, to form first and second through holes 92a and 92b. Here, the second insulation layer 60 and the sidewall insulation layer 62 function as stopper layers. Therefore, the gate electrode 30 is not exposed. Then, the resist layer R1 is removed.

Next, as shown in FIG. 1, first and second contact layers 92a and 92b are formed to fill the first and second through holes 90a and 90b, respectively, by a known method. Next, a wiring layer 94 having a specified pattern is formed on the second contact layer 92b and the third insulation layer 70. In the manner described above, a semiconductor device 100 is manufactured.

The present embodiment preferably includes one or more of the effects described below.

(1) In the present embodiment, the gate electrode 30 is covered by the second insulation layer 60 and the sidewall insulation layer 62. As a result, when the first insulation layer 50 is etched to form the through holes 90a and 90b, the gate electrode 30 is not exposed. Accordingly, the first through hole 90a can be formed in a self-alignment manner with respect to the gate electrode 30. In other words, a self-aligned-contact can be achieved. The "self-aligned-contact" is herebelow referred to as "SAC".

(2) In the present embodiment, the metal layer 34 is formed after the source and drain regions 40 are formed. As a result, when a resist, which is provided to form the source and drain regions 40, is removed, an acid chemical agent (for example, sulfuric acid) may be used.

(3) The present embodiment includes the step of etching the polysilicon layer 32 to form a recessed section. In this step, not the entire polysilicon layer 32 is removed, but only a specified thickness thereof is partially removed. As a result, in the etching of the polysilicon layer 32, the gate dielectric layer 20 is not exposed. Accordingly, the gate dielectric layer 20 is prevented from being damaged during the etching of the polysilicon layer 32.

(4) In the present embodiment, the polysilicon layer 32 is formed in a manner to contact the gate dielectric layer 20 at the gate electrode 30. As a result, a variety of process techniques to be employed when a gate electrode 30 is formed from polysilicon can be used. It is noted that, when the polysilicon layer 32 is entirely removed such that the gate electrode is formed only from a metal layer, a work function difference between the gate electrode and the silicon substrate becomes greater compared to when the gate electrode includes silicon. As a result, when the gate electrode is formed only from a metal layer, a variety of process techniques to be employed when a gate electrode is formed from silicon are difficult to be employed.

(5) A MOS transistor with its gate electrode having a stacked layered structure of a polysilicon layer and a metal layer can be formed, for example, in the following manner.

Figure 9:
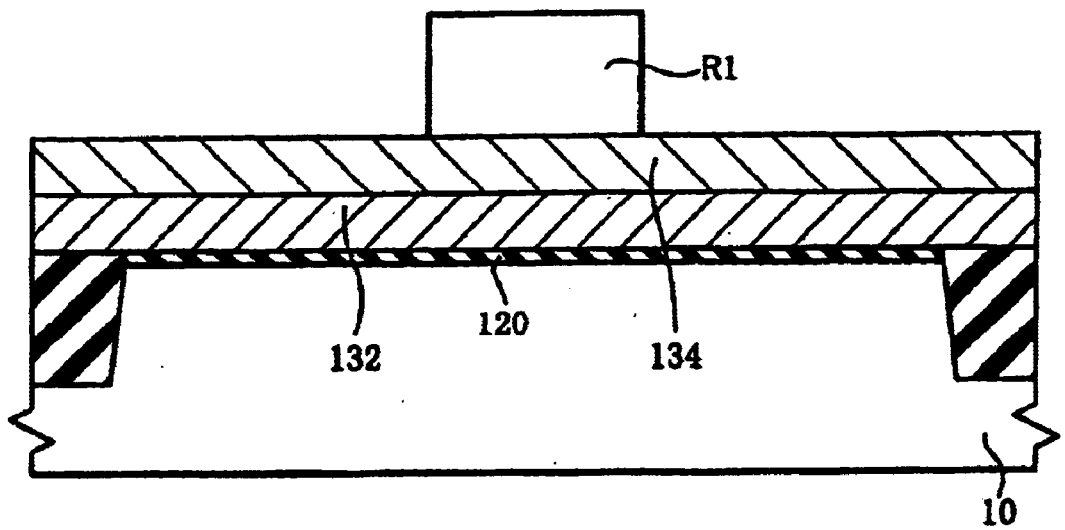
FIGS. 9(a) and 9(b) schematically show a cross-sectional view illustrating one step of a method for manufacturing a semiconductor device in accordance with an example for comparing the effects.

First, as shown in FIG. 9, a gate dielectric layer 120, a polysilicon layer 132 and a metal layer 134 are successively deposited on a silicon substrate 10. Next, a resist layer R1 is formed on the metal layer 134. Next, the metal layer 134 and the polysilicon layer 132 are etched using the resist layer R1 as a mask, to form a gate electrode 130. Then, the resist layer R1 is removed.

Figure 10:
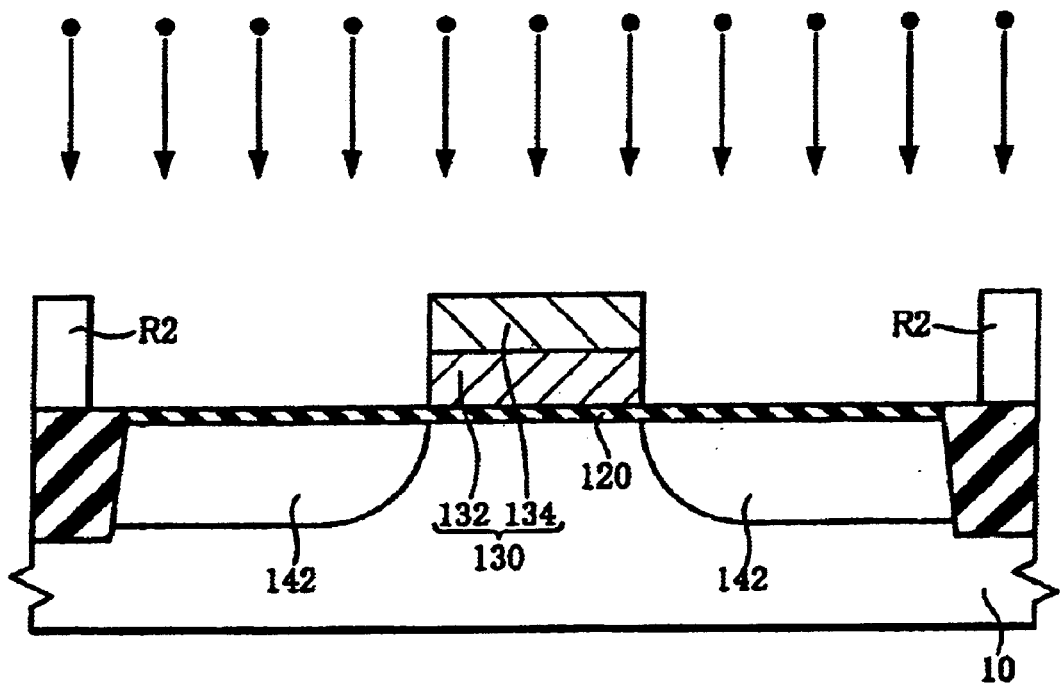
FIG. 10 schematically shows a cross-sectional view illustrating one step of a method for manufacturing a semiconductor device in accordance with an example for comparing the effects.

Next, as shown in FIG. 10, a resist layer R2 having a specified pattern is formed over the silicon substrate 10. Next, an impurity is ion-implanted in the silicon substrate 10 using the resist layer R2 as a mask, to form a low concentration impurity diffusion layer 142. Then, the resist layer R2 is removed.

Figure 11:
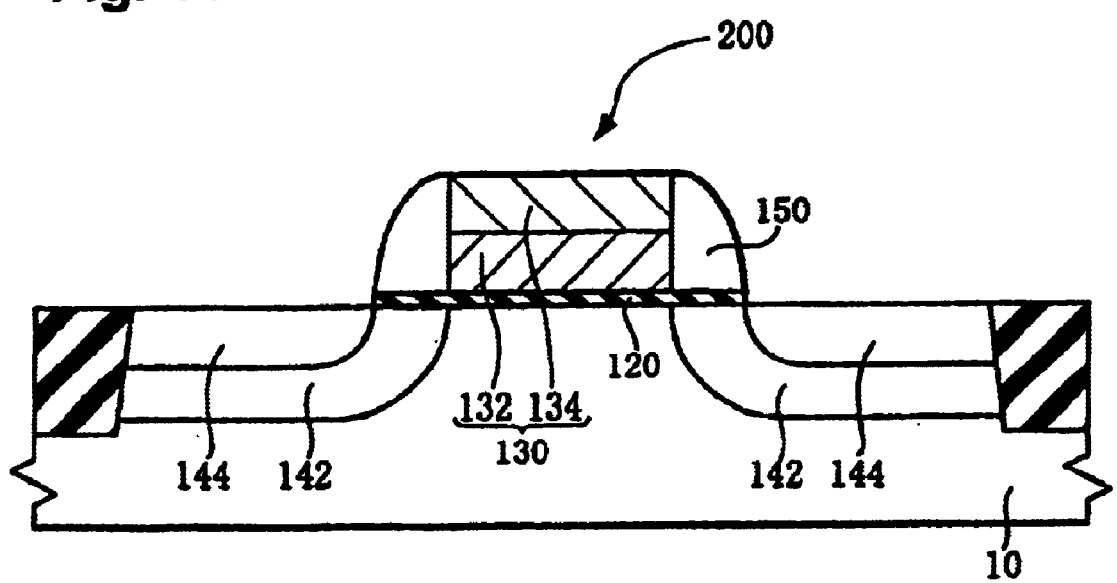
FIG. 11 schematically shows a cross-sectional view illustrating one step of a method for manufacturing a semiconductor device in accordance with an example for comparing the effects.

Next, as shown in FIG. 11, sidewall spacers 150 are formed on side walls of the gate electrode 130. Next, a resist layer having a specified pattern is formed on the silicon substrate 10. Next, an impurity is ion-implanted in the silicon substrate using the resist layer as a mask, to form a high concentration impurity diffusion layer 144. Then, the resist layer is removed. In this manner, a MOS transistor 200 is manufactured.

It is noted that the resist layers (the resist layer R1 for forming the gate electrode and the resist layer R2 for forming the impurity diffusion layer) may preferably be removed by an acid chemical agent (for example, sulfuric acid). However, when an acid chemical agent is used for removing the resist layers, the metal layer 134 is exposed to the acid chemical agent, and the metal layer 134 is corroded. When the metal layer 134 is corroded, the electrical characteristic of the semiconductor device deteriorates. Therefore, when the gate electrode 130 includes a metal layer 134, it is difficult to use an acid chemical agent. On the other hand, although the use of a chemical agent other than an acid chemical agent may be considered, it is difficult to adequately remove the resist layer with such a chemical agent.

However, in accordance with the present embodiment, the metal layer 34 is formed after the source and drain regions 40 are formed. As a result, when the resist layer that is provided for forming the source and drain regions 40 is removed, an acid chemical agent (for example, sulfuric acid) may be used.

The above-described embodiments may be modified, for example, in the following manner.

(1) In the above-described method embodiment, the gate electrode 30 is formed by successively depositing the polysilicon layer 32 and the metal layer 34. However, the gate electrode 30 can be formed by successively depositing a polysilicon layer and a silicide layer. In other words, the metal layer can be replaced with the silicide layer.

The silicide layer can be formed, for example, by the following manner.

Figure 8:
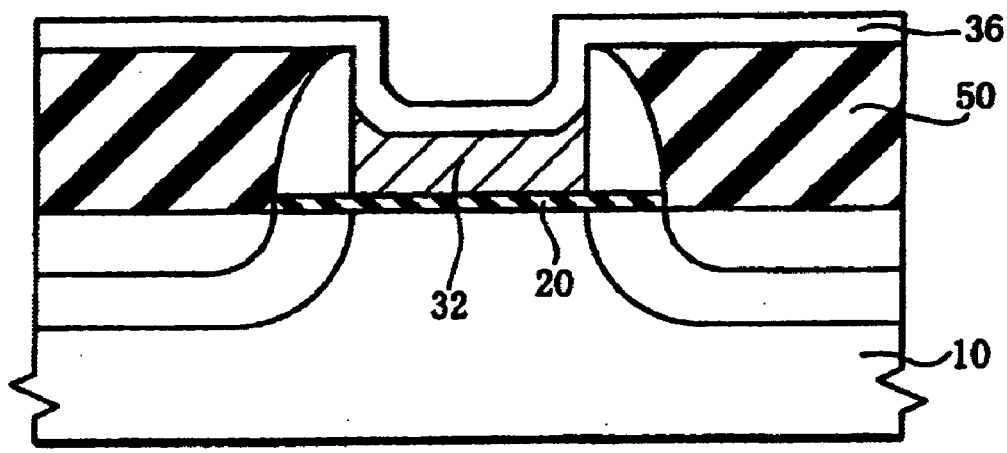
FIGS. 8(a) and 8(b) schematically show cross-sectional views illustrating steps of a method for manufacturing a semiconductor device in accordance with an embodiment of the present invention.
Figure 8:
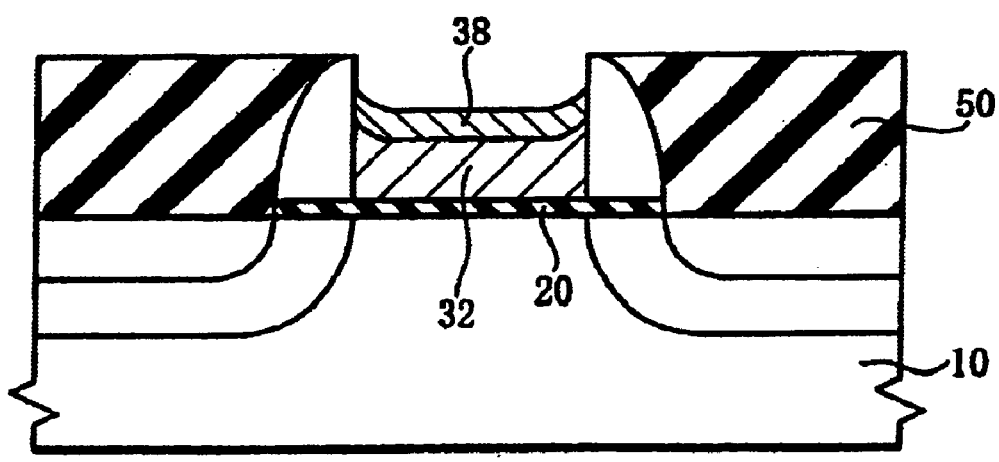

First, as shown in FIG. 8(a), a metal layer 36 for silicidation is formed over the entire surface. The thickness of the metal layer may be, for example, 5–50 nm. The metal layer 36 can be formed, for example, by a CVD method, a sputtering method, or the like. For example, the material of the metal layer 36 may be titanium, cobalt or nickel.

Next, as shown in FIG. 8(b), a heat treatment is conducted to make a silicide with the polysilicon layer 32. The heat treatment may be conducted at temperatures of, for example, 500–900° C. The heat treatment can be conducted by, for example, a lamp anneal. The time for the heat treatment is determined in view of the heat treatment temperature, and may be, for example, 10–60 seconds.

Next, non-reacted portions of the metal layer 36 are removed. In this manner, a silicide layer 38 can be formed on the polysilicon layer 32.

By the modified embodiments, the following effects may be achieved.

Conventionally, the following method is conducted when a silicide layer is formed on a polysilicon layer that functions as a gate electrode. As shown in FIG. 12(a), a MIS transistor including a polysilicon layer 230 that functions as a gate electrode is formed, and then a metal layer 242 is formed. Next, a heat treatment is conducted to make a silicide of the metal layer 242 and the polysilicon layer 230. Next, non-reacted portions of the metal layer 242 are removed, whereby, as shown in FIG. 12(b), a silicide layer 240 is formed on the polysilicon layer 230. However, when a silicide layer is formed on a polysilicon layer by the method described above, the silicide layer is exposed, and it is difficult to apply SAC in a step to be conducted later.

However, by the modified embodiment, when the polysilicon layer is formed into a silicide to form a silicide layer, the silicide layer is covered by the second insulation layer at the same time. This provides an effect in that a SAC can be applied.

(2) In the embodiment described above, the gate electrode is formed from conduction layers in two layers. However, the gate electrode can be formed from conduction layers in three or more layers.

The present invention is not limited to the embodiments described above, and many modifications can be made within the scope of the subject matter of the present invention.

What is claimed:

1. A method for manufacturing a semiconductor device, the method comprising the steps of:

(a) forming a gate dielectric layer on a semiconductor layer;

(b) forming a first conductive layer having a specified pattern on the gate dielectric layer;

(c) forming sidewall insulation layers on side walls of the first conductive layer;

(d) forming a source region and a drain region in the semiconductor layer;

(e) depositing a first insulation layer that covers the first conductive layer and the sidewall insulation layers, the first insulation layer comprising a material different from that of the sidewall insulation layers;

(f) planarizing the first insulation layer until an upper surface of the first conductive layer is exposed;

(g) removing a part of the first conductive layer between the sidewall insulation layers in a manner that the gate dielectric layer is not exposed to thereby form a recessed section on the first conductive layer between the sidewall insulation layers;

(h) partially filling the recessed section between the sidewall insulation layers with a second conductive layer to form a gate electrode that includes at least the first conductive layer and the second conductive layer;

(i) forming a second insulation layer that fills the recessed section between the sidewall insulation layers on the second conductive layer, the second insulation layer comprising a material different from that of the first insulation layer;

j) etching the first insulation layer to form a first through hole that reaches the source region or the drain region; and k) forming a first contact layer in the first through hole.

2. A method for manufacturing a semiconductor device according to claim 1, wherein, in the step (j), the second insulation layer and the sidewall insulation layers comprise a material that is more resistant to an etchant than the first insulation layer.

3. A method for manufacturing a semiconductor device according to claim 1, wherein the first conductive layer is a silicon layer, and the step (h) includes the steps of
   (h-1) depositing a metal layer for siliciding the first conductive layer on the first conductive layer; and
   (h-2) siliciding the first conductive layer to form a suicide layer.

4. A method for manufacturing a semiconductor device according to claim 1, further comprising:
   (l) forming a third insulation layer on the first insulation layer and the second insulation layer;
   (m) etching the third insulation layer to form a second through hole; and
   (n) forming a second contact layer in the second through hole, wherein the second through hole overlaps the first through hole.

5. A method for manufacturing a semiconductor device according to claim 1, wherein the first insulation layer comprises silicon oxide and the second insulation layer comprises silicon nitride.

6. A method for manufacturing a semiconductor device according to claim 1, wherein the first insulation layer comprises silicon oxide and the sidewall insulation layers comprise silicon nitride.

7. A method far manufacturing a semiconductor device, comprising:
   forming a gate dielectric layer on a semiconductor layer;
   forming a first conductive layer having a specified pattern on the gate dielectric layer;
   forming sidewall insulation layers on side walls of the first conductive layer;
   forming a source region and a drain region in the semiconductor layer;
   removing a part of the first conductive layer between the sidewall insulation layers in a manner so that the gate dielectric layer is not exposed and a portion of the first conductive layer remains on the sate dielectric layer between the sidewall insulation layers, to thereby form a recessed section between the sidewall insulation layers, wherein the removing a part of the first conductive layer is carried out after formation of the source region and the drain region;
   forming a second conductive layer in a portion of the recessed section on the portion of the first conductive layer that remains between the sidewall insulation layers; and
   forming an insulation layer in the recessed section on the second conductive layer between the sidewall insulation layers.

8. A method for manufacturing a semiconductor device according to claim 7, further comprising, after forming the source region and the drain region and before removing a part of the first conductive layer:
   forming a first insulating layer that covers the first conductive layer, the sidewall insulation layers, and the semiconductor layer; and
   planarizing the first insulation layer so that the first conductive layer is exposed.

9. A method for manufacturing a semiconductor device according to claim 8, further comprising, after forming the insulation layer in the recessed section above the second conductive layer:
   etching the first insulation layer to form a first through hole that reaches the source region or the drain region; and
   forming a first contact layer in the first through hole.

10. A method for manufacturing a semiconductor device according to claim 7, wherein the second conductive layer comprises a silicide.

11. A method for manufacturing a semiconductor device according to claim 7, wherein the removing a part of the first conductive layer further includes removing a greater depth of the first conductive layer from a center region than from end regions adjacent to the sidewall insulation layers.

12. A method for manufacturing a semiconductor device according to claim 7, wherein the first insulation layer comprises silicon oxide, and the second insulation layer comprises silicon nitride.

13. A method for manufacturing a semiconductor device, comprising:
   forming a gate dielectric layer on a semiconductor layer;
   forming a first conductive layer having a specified pattern on the gate dielectric layer;
   after the forming the first conductive layer having a specified pattern on the gate dielectric layer, forming sidewall insulation layers on side walls of the first conductive layer so that the first conductive layer in its entirety is positioned between the sidewall insulation layers;
   after forming the sidewall insulation layers,(removing a first portion of the first conductive layer between the sidewall insulation layers in a manner so that a second portion of the first conductive layer remains between on the gate dielectric layer between the sidewall insulation layers and a gap remains above the second portion of the first conductive layer between the sidewall insulation layers;
   forming a second conductive layer on the second portion of the first conductive layer and removing a first portion of the second conductive layer so that a second portion of the second conductive layer remains on the first conductive layer between the sidewall insulation layers, wherein the second portion of the second conductive layer does not entirely fill the gap between the sidewall insulation layers; and
   forming an insulation layer on the second portion of the second conductive layer to fill the gap between the sidewall insulation layers.

14. A method for manufacturing a semiconductor device according to claim 13, wherein the first conductive layer comprises polycrystalline silicon and the second conductive layer comprises a material selected from the group consisting of a metal and a compound of metal and silicon.

15. A method for manufacturing a semiconductor device according to claim 13, wherein the second conductive layer includes at least one metal selected from the group consisting of W, Al, and Cu.

16. A method for manufacturing a semiconductor device according to claim 13, wherein the second conductive layer comprises a silicide.

17. A method for manufacturing a semiconductor device according to claim 13, further comprising forming the sidewall insulation layers from silicon nitride and in direct contact with the first conductive layer.

18. A method for manufacturing a semiconductor device according to claim 13, wherein the removing a first portion of the first conductive layer between the sidewall insulation layers further includes removing a greater depth of the first conductive layer from a center region than from end regions adjacent to the sidewall insulation layers.

* * * * *